US012771316B2

(12) United States Patent
Iwamoto

(10) Patent No.: US 12,771,316 B2
(45) Date of Patent: Oct. 20, 2026

(54) ACOUSTIC WAVE DEVICE AND ACOUSTIC WAVE MODULE

(71) Applicant: Murata Manufacturing Co., Ltd., Nagaokakyo (JP)

(72) Inventor: Takashi Iwamoto, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 840 days.

(21) Appl. No.: 18/122,742

(22) Filed: Mar. 17, 2023

(65) Prior Publication Data

US 2023/0216477 A1 Jul. 6, 2023

Related U.S. Application Data

(63) Continuation of application No. PCT/JP2021/033755, filed on Sep. 14, 2021.

(30) Foreign Application Priority Data

Sep. 25, 2020 (JP) ................................ 2020-160769

(51) Int. Cl.
*H03H 9/17* (2006.01)
*H03H 9/13* (2006.01)

(52) U.S. Cl.
CPC ................ *H03H 9/17* (2013.01); *H03H 9/13* (2013.01)

(58) Field of Classification Search
CPC .. H03H 9/059; H03H 9/02574; H03H 9/1092; H03H 9/0547; H03H 9/0542; H03H 9/02866; H03H 9/13; H03H 9/17
See application file for complete search history.

(56) References Cited

U.S. PATENT DOCUMENTS

2006/0022768 A1* 2/2006 Yokota ................. H03H 9/1085 333/133
2013/0057113 A1 3/2013 Miyake
2014/0130319 A1* 5/2014 Iwamoto ................ H03H 9/059 29/25.35
2014/0320234 A1* 10/2014 Takemura ............ H03H 9/1092 333/195

(Continued)

FOREIGN PATENT DOCUMENTS

JP 61269410 A 11/1986
JP 2001053579 A 2/2001

(Continued)

OTHER PUBLICATIONS

International Search Report in PCT/JP2021/033755, mailed Nov. 22, 2021, 4 pages.

(Continued)

*Primary Examiner* — J. San Martin
(74) *Attorney, Agent, or Firm* — Keating & Bennett, LLP

(57) ABSTRACT

An acoustic wave device includes an acoustic wave element substrate, filter electrodes on a first surface of the acoustic wave element substrate, a first insulator layer covering a second surface of the acoustic wave element substrate, and a second insulator layer laminated on the first insulator layer and sandwiching the first insulator layer between the second insulator layer and the acoustic wave element substrate. The products of propagation speeds of an acoustic wave in those layers and densities of those layers satisfy a predetermined relationship.

18 Claims, 4 Drawing Sheets

(56) References Cited

U.S. PATENT DOCUMENTS

| | | | | |
|---|---|---|---|---|
| 2019/0222189 | A1* | 7/2019 | Tai | H03H 9/02834 |
| 2020/0119712 | A1 | 4/2020 | Matsumoto et al. | |
| 2020/0389147 | A1 | 12/2020 | Iwamoto | |
| 2021/0057635 | A1 | 2/2021 | Allibert et al. | |

FOREIGN PATENT DOCUMENTS

| | | | |
|---|---|---|---|
| JP | 2014216971 | A | 11/2014 |
| JP | 2020057851 | A | 4/2020 |
| JP | 2020123855 | A | 8/2020 |
| JP | 2020202429 | A | 12/2020 |
| WO | 2011148705 | A1 | 12/2011 |
| WO | 2013115115 | A1 | 8/2013 |
| WO | 2018235875 | A1 | 12/2018 |
| WO | 2019186011 | A1 | 10/2019 |

OTHER PUBLICATIONS

Written Opinion in PCT/JP2021/033755, mailed Nov. 22, 2021, 5 pages.

* cited by examiner

ACOUSTIC WAVE DEVICE AND ACOUSTIC WAVE MODULE

CROSS REFERENCE TO RELATED APPLICATIONS

This application claims the benefit of priority to Japanese Patent Application No. 2020-160769 filed on Sep. 25, 2020 and is a Continuation Application of PCT Application No. PCT/JP2021/033755 filed on Sep. 14, 2021. The entire contents of each application are hereby incorporated herein by reference.

BACKGROUND OF THE INVENTION

1. Field of the Invention

The present disclosure relates to an acoustic wave device and an acoustic wave module including the acoustic wave device.

2. Description of the Related Art

Japanese Unexamined Patent Application Publication No. 2014-216971 discloses a structure of an acoustic wave device which can improve isolation characteristics and can achieve a reduction in size.

Recently, a demand for a reduction in height to achieve higher integration has become stronger in the field of an acoustic wave module using an acoustic wave device. To meet such a demand, a reduction in thickness of an acoustic wave element substrate is required.

FIG. 12 is an explanatory view to explain a problem with the reduction in thickness of the acoustic wave element substrate.

In the structure disclosed in Japanese Unexamined Patent Application Publication No. 2014-216971, the acoustic wave device is fixedly held on a module substrate with encapsulation resin. However, when the thickness of the acoustic wave element substrate is reduced, the influence of a bulk wave W12 propagating in the substrate and reflecting at a rear surface of the acoustic wave element substrate 512 in contact with the resin is not negligible, and filter characteristics of an acoustic wave element deteriorate. More specifically, ripples or spurious responses are caused in an acoustic wave element filter. Thus, the deterioration of the characteristics attributable to the influence of an unwanted wave gives rise to a situation in which the demand for the reduction in thickness of the element substrate cannot be met.

Furthermore, using a structure in which the acoustic wave element substrate 512 and a different acoustic wave element substrate 538 are stacked one above the other is considered as a solution for achieving the higher integration. To restrict the height of the stacked structure, the thickness of each acoustic wave element substrate needs to be made as thin as possible. In such a case, a demand for reducing the height of the stacked substrate cannot be met due to the influence of the bulk wave generating in the acoustic wave element substrate 538 in a similar manner.

SUMMARY OF THE INVENTION

Preferred embodiments of the present invention provide acoustic wave devices that are each able to reduce a thickness of an acoustic wave element substrate while reducing or preventing deterioration of characteristics, and acoustic wave modules each including such an acoustic wave device.

A preferred embodiment of the present invention relates to an acoustic wave device having a predetermined pass band. The acoustic wave device includes an acoustic wave element substrate, a comb-shaped filter electrode on a first surface of the acoustic wave element substrate and allowing an acoustic wave in the pass band to pass therethrough, a first insulator layer covering a second surface of the acoustic wave element substrate, and a second insulator layer laminated on the first insulator layer and sandwiching the first insulator layer between the second insulator layer and the acoustic wave element substrate. Assuming that propagation speeds of the acoustic wave in the pass band in the acoustic wave element substrate, the first insulator layer, and the second insulator layer are denoted by $V0$, $V1$, and $V2$, respectively, and densities of the acoustic wave element substrate, the first insulator layer, and the second insulator layer are denoted by $\rho 0$, $\rho 1$, and $\rho 2$, respectively, $V0 \times \rho 0 > V1 \times \rho 1 > V2 \times \rho 2$ is satisfied.

With the acoustic wave devices and the acoustic wave modules according to preferred embodiments of the present disclosure, since deterioration of characteristics caused by an unwanted wave reflecting from a rear surface of the acoustic wave element substrate are able to be reduced even when a thickness of the acoustic wave element substrate is reduced, a stacked structure body is able to be provided which exhibits good characteristics and has a reduced height.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
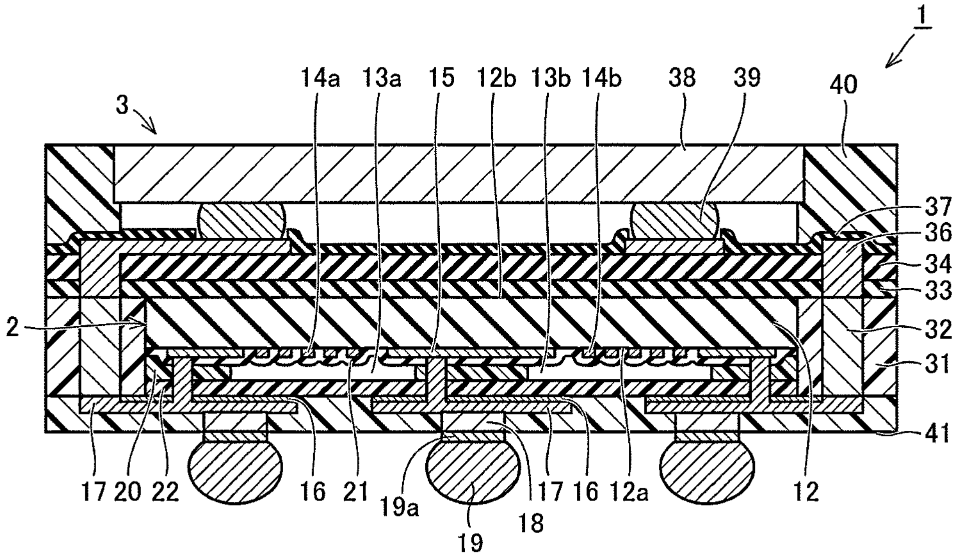
FIG. 1 is a sectional view of an acoustic wave module including an acoustic wave device according to a preferred embodiment of the present invention.

Preferred embodiments of the present invention will be described in detail below with reference to the drawings.

The same or equivalent components in the drawings are indicated by the same reference signs and description of those components is not repeated.

FIG. 1 is a sectional view of an acoustic wave module including an acoustic wave device according to a preferred embodiment of the present invention. Referring to FIG. 1, an acoustic wave module 1 includes an acoustic wave device 2 and an electronic device 3. The acoustic wave module 1 is a module in which the acoustic wave device 2 and the electronic device 3 are encapsulated into an integral form with encapsulation resin 40. The electronic device 3 may be, for example, an acoustic wave device similar to the acoustic wave device 2 or a different type of electronic device.

The acoustic wave device 2 includes a filter element having a predetermined pass band BW and utilizing a surface acoustic wave. The acoustic wave device 2 includes an acoustic wave element substrate 12, comb-shaped filter electrodes 14*a* and 14*b* provided on a first surface 12*a* of the acoustic wave element substrate 12 and allowing the acoustic wave in the pass band to pass therethrough, a first insulator layer 33 covering a second surface 12*b* of the acoustic wave element substrate, and a second insulator layer 34 laminated on the first insulator layer 33 and sandwiching the first insulator layer 33 between the second insulator layer 34 and the acoustic wave element substrate 12.

Usually, when a thickness of the acoustic wave element substrate 12 is reduced, the influence of an unwanted wave (bulk wave) reflecting at a rear surface of the acoustic wave element substrate 12 increases and, the characteristics deteriorate due to an increase of ripples and spurious responses. To overcome the above-described problem, in the acoustic wave device 2 according to the present preferred embodiment, the first insulator layer 33 is disposed between the second insulator layer 34 and the second surface 12*b* of the acoustic wave element substrate.

Assuming that propagation speeds of the acoustic wave in the pass band BW in the acoustic wave element substrate 12, the first insulator layer 33, and the second insulator layer 34 are denoted by V0, V1, and V2, respectively, and that densities of the acoustic wave element substrate 12, the first insulator layer 33, and the second insulator layer 34 are denoted by ρ0, ρ1, and ρ2, respectively. In the present preferred embodiment, material properties of the first insulator layer 33 and the second insulator layer 34 are selected to satisfy $V0 \times \rho 0 > V1 \times \rho 1 > V2 \times \rho 2$.

With the above-described feature, it is possible to increase a ratio of a "bulk wave component propagating from the acoustic wave element substrate 12→the first insulator layer 33→the second insulator layer 34" to a "bulk wave component reflecting at an interface between the acoustic wave element substrate 12 and the first insulator layer 33 and propagating into the acoustic wave element substrate 12 again." In other words, since a component of the unwanted wave (bulk wave) reflecting toward the inside of the acoustic wave element substrate 12 is reduced, the deterioration of the filter characteristics can be reduced or prevented.

The above-described feature can more reliably reduce or prevent the characteristic deterioration attributable to the influence of the bulk wave than usual while reducing the thickness of the acoustic wave element substrate 12. Stated in another way, the ripple and the spurious response caused by the unwanted wave can be reduced or prevented. As a result, the acoustic wave device achieves both a reduction in height and good characteristics of the acoustic wave filter.

Preferably, the material properties of the first insulator layer 33 and the second insulator layer 34 are selected such that an elastic modulus of the first insulator layer 33 and an elastic modulus of the second insulator layer 34 are each smaller than an elastic modulus of the acoustic wave element substrate 12.

The bulk wave advancing from the acoustic wave element substrate 12 to the first insulator layer 33 and the second insulator layer 34 has a higher attenuation rate when it propagates in the first insulator layer 33 and the second insulator layer 34 than when it propagates in the acoustic wave element substrate 12. Accordingly, the bulk wave component returning to the acoustic wave element substrate 12 is attenuated at a higher rate than the bulk wave component immediately before reflecting at the interface, and this is advantageous in reducing or preventing the characteristic deterioration of the acoustic wave device.

Preferably, surface roughness RSm of the second surface 12*b* of the acoustic wave element substrate 12 is smaller (shorter) than a wavelength of the acoustic wave in the pass band BW. By setting the surface roughness RSm of the second surface 12*b* of the acoustic wave element substrate 12 to be smaller (shorter) than the wavelength of the acoustic wave in the pass band, the bulk wave can be scattered in a boundary portion between the acoustic wave element substrate 12 and the first insulator layer 33. This can also reduce the bulk wave component that causes the characteristic deterioration.

In the present preferred embodiment, a non-limiting example of a method of manufacturing the acoustic wave module 1 with the stacked structure of the acoustic wave device 2 and the different electronic device 3, the acoustic wave device 2 being provided as described above and including the acoustic wave element substrate 12 with the reduced thickness, will be described below with reference to FIGS. 1 to 8.

FIGS. 2 to 8 are sectional views to explain a non-limiting example of a method of manufacturing the acoustic wave module 1.

Figure 2:
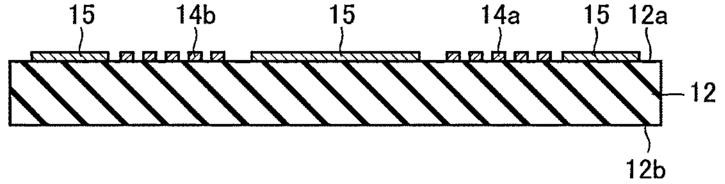
FIG. 2 is a first sectional view to explain a method of manufacturing an acoustic wave module according to a preferred embodiment of the present invention.

First, as illustrated in FIG. 2, a first wiring layer is formed on the acoustic wave element substrate 12 (for example, LT:$LiTaO_3$ or LN:$LiNbO_3$) in regions where conductive patterns including an acoustic wave excitation electrode (the comb-shaped filter electrodes (also called IDTs=interdigital transducers) 14*a* and 14*b* in the case of a surface wave element), wiring 15, and so on are to be disposed. In more detail, a resist pattern used in liftoff is formed on the acoustic wave element substrate 12 with, for example, a photolithography technique, the resist pattern including openings formed in the regions where the conductive patterns are to be formed. Then, a metal including aluminum (Al) as a main component is vapor-deposited to form a film. Then, the acoustic wave element substrate 12 is dipped in a peel-off liquid and is shaken to peel (lift) off the resist pattern. The first wiring layer is thus formed.

The wiring 15 may be, for example, two-layer wiring. In the case of the two-layer wiring, a second wiring layer is formed by forming a resist pattern including openings in regions where a metal film is to be formed to reduce wiring resistance, those regions corresponding to a pad electrode, a routing wiring portion, and so on, then vapor-depositing the metal film, and then lifting off the resist pattern. The metal film used in the above example may be, for example, a single-layer metal film of aluminum (Al), copper (Cu), nickel (Ni), gold (Au), or platinum (Pt), or a metal film having a multilayer structure including at least two or more of single-layer metal films of those materials. When a surface layer of the second wiring layer is plated, for example, Cu, Ni, Au, Pt, or the like with high plating performance is preferably used.

Figure 3:
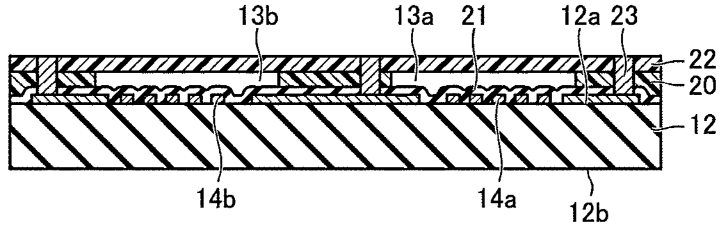
FIG. 3 is a second sectional view to explain a method of manufacturing an acoustic wave module according to a preferred embodiment of the present invention.

Next, as illustrated in FIG. 3, a protective film 21, a support layer 20, and a cover layer 22 are formed. In more detail, the support layer 20 is formed as, for example, a polyimide pattern by coating photosensitive polyimide and by causing the coated polyimide to be subjected to exposure and development. The polyimide pattern includes voids formed in portions corresponding to a region where the IDTs 14*a* and 14*b* are disposed and a region where a portion of the wiring 15 is disposed. After forming the pattern, the polyimide is solidified by heating, and organic substances adhering to the IDTs 14*a* and 14*b* are removed with oxygen plasma. The voids formed in the pattern are used as encapsulation spaces 13*a* and 13*b* for the IDTs 14*a* and 14*b* and as a through-hole in which a conductor 23 is buried later.

Instead of the polyimide, another material may also be used insofar as amounts of outgas and halogen are sufficiently small and the material has heat resistance and strength. Examples of that material include benzocyclobutene and silicone.

Next, the cover layer 22 is formed. The cover layer 22 is made of resin, and a polyimide film can be used as an example. On a surface of the polyimide film, for example, thermoplastic polyimide resin is coated as a bonding layer. The cover layer 22 is heat-bonded to the support layer 20 by roll-laminating the polyimide film on the support layer 20 with a roller heated to about 100° C., for example. As a result, primary encapsulation is performed on the encapsulation spaces 13*a* and 13*b* around the IDTs 14*a* and 14*b*.

Furthermore, the conductor 23 for taking out a signal of the acoustic wave filter is formed, an external terminal is formed, and cutting into individual pieces with a dicing machine is performed. Thus, a filter element as a basic component of the acoustic wave device 2 is fabricated. (FIG. 3).

Figure 4:
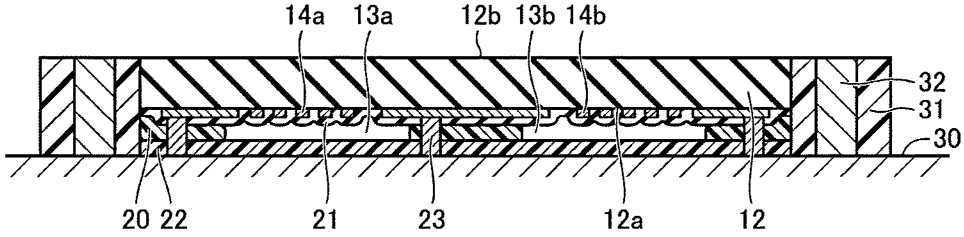
FIG. 4 is a third sectional view to explain a method of manufacturing an acoustic wave module according to a preferred embodiment of the present invention.

Next, as illustrated in FIG. 4, the filter elements are placed side by side on an adhesive layer 30 in a face-down state, and a through-electrode 32 for use in electrically connecting front and rear surfaces of encapsulation resin to encapsulate each filter element later is formed. After encapsulating the filter element and the through-electrode 32 with encapsulation resin 31, the acoustic wave element substrate 12 is polished from the rear surface side (upper side in FIG. 4).

Moreover, the second surface 12*b* (rear surface), namely the polished surface, of the acoustic wave element substrate 12 is textured to have fine irregularities by lapping. The surface roughness RSm obtained at that time is preferably set to be smaller than the wavelength of a signal in the pass band BW of the acoustic wave element device. This is effective in scattering the unwanted wave having reached the second surface 12*b* (rear surface) of the acoustic wave element substrate 12 and reducing or preventing the adverse influence upon the characteristics of the acoustic wave filter. For example, Mean Length (RSm) of Roughness Curve Element defined in JISB0601:2013 can be used as the surface roughness RSm.

Figure 5:
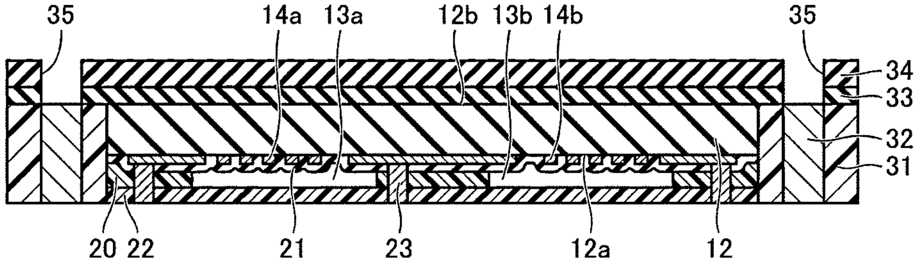
FIG. 5 is a fourth sectional view to explain a method of manufacturing an acoustic wave module according to a preferred embodiment of the present invention.

Next, as illustrated in FIG. 5, the first insulator layer 33 is formed on the second surface 12*b* (rear surface) of the acoustic wave element substrate 12, and the second insulator layer 34 is formed on the first insulator layer 33.

The propagation speeds of the bulk wave in the pass band in the acoustic wave element substrate 12, the first insulator layer 33, and the second insulator layer 34 are denoted by V0, V1, and V2, respectively, and the densities of the acoustic wave element substrate 12, the first insulator layer 33, and the second insulator layer 34 are denoted by $\rho 0$, $\rho 1$, and $\rho 2$, respectively. In the present preferred embodiment, the material properties of the first insulator layer 33 and the second insulator layer 34 are selected to satisfy $V0 \times \rho 0 > V1 \times \rho 1 > V2 \times \rho 2$.

The first insulator layer 33 and the second insulator layer 34 can be formed by any suitable method of spin coating, spray coating, sputtering, CVD (Chemical Vapor Deposition), electron beam vapor deposition, printing, pressing, or film lamination, for example.

Combination examples of materials of the acoustic wave element substrate 12, the first insulator layer 33, and the second insulator layer 34 are described below. Assuming the materials of the acoustic wave element substrate 12, the first insulator layer 33, and the second insulator layer 34 to be denoted by A, B, and C, respectively, (A, B, C) can be, for example, (LT substrate, SOG film, epoxy encapsulation material).

In the case of the layers including the same filler, (A, B, C) can be, for example, (LT substrate, epoxy resin with filler content by volume of about 90%, epoxy resin with filler content by volume of about 70%).

In the case of the filler contents being the same (or substantially the same), (A, B, C) can be, for example, (LT substrate, epoxy resin containing alumina filler, epoxy resin containing silica filler).

A combination of (LT substrate, epoxy encapsulation material including filler, polyimide), a combination of (LT substrate, silicon oxide film, resin (any of phenol resin, olefin resin, and polybenzoxazole), and so on, for example, may also be used as other combination examples of (A, B, C).

Materials with smaller elastic moduli than the LT substrate are preferably selected for the first insulator layer 33 and the second insulator layer 34. By using those materials, since the unwanted wave is attenuated while propagating in the first insulator layer 33 and the second insulator layer 34, the influence upon the characteristics of the acoustic wave device can be reduced even when the unwanted wave returns into the acoustic wave element substrate 12.

A thickness of each of the first insulator layer 33 and the second insulator layer 34 is preferably, for example, about 1 μm to about 20 μm. The reason for this is as follows. If the thickness of each layer is about 1 μm or less, the advantageous effect of attenuating the unwanted wave is difficult to obtain. On the other hand, if the thickness is about 20 μm or more, the advantage effect of reducing the thickness of the acoustic wave element substrate 12 is not obtained.

Furthermore, as illustrated in FIG. 5, a void 35 is formed in the first insulator layer 33 and the second insulator layer 34 with, for example, a laser to make the wiring connectable to the through-electrode 32. Residues after laser processing are then removed by performing, for example, a desmear process or a plasma process.

Figure 6:
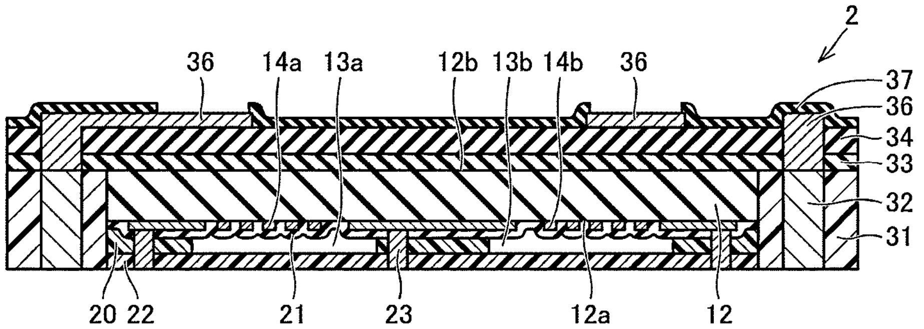
FIG. 6 is a fifth sectional view to explain a method of manufacturing an acoustic wave module according to a preferred embodiment of the present invention.

Next, as illustrated in FIG. 6, a metal layer 36 defining and functioning as a wiring layer and a mounting pad for solder connection is formed on the second insulator layer 34. More specifically, the void 35 is filled with a connection member and the metal layer 36 is formed on the second insulator layer 34 by, for example, electrolytic or electroless plating. In an example, a resist pattern with openings in regions where the wiring and the mounting pad are to be formed is formed, and a metal film is vapor-deposited. Then, the metal film in an unnecessary region is lifted off and removed together with the resist. As a result, the metal wiring and the mounting pad in a desired pattern are formed. Thereafter, a protective film 37 with an opening in a region corresponding to the mounting pad is formed, and a wafer including the acoustic wave device 2 is completed.

At this stage, the first insulator layer 33 and the second insulator layer 34 are already formed on the second surface 12*b* of the acoustic wave element substrate 12. Accordingly, even when the acoustic wave device 2 is supplied to a different manufacturer and is stacked with the electronic device 3 later, the structure of attenuating the unwanted wave is provided. In the acoustic wave device 2 according to the present preferred embodiment, the characteristic deterioration caused by the bulk wave is suppressed regardless of the properties of materials used by the different manufacturer for encapsulation.

Figure 7:
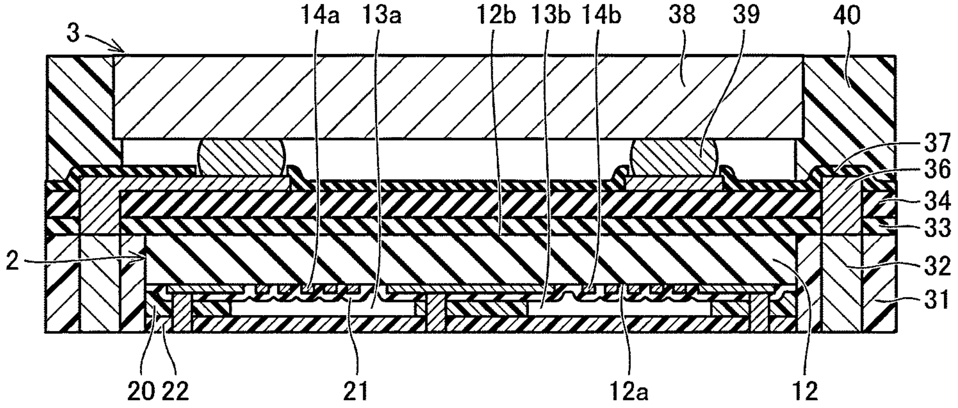
FIG. 7 is a sixth sectional view to explain a method of manufacturing an acoustic wave module according to a preferred embodiment of the present invention.

Next, as illustrated in FIG. 7, the electronic device 3 to be stacked is mounted to the mounting pad that is a portion of the metal layer 36. The electronic device 3 to be stacked may be an electronic component other than the acoustic wave filter. The electronic device 3 may be, for example, a high-frequency switch, an LNA (Low Noise Amplifier), an IPD (Integrated Passive Device), an antenna device, or a sensor element.

Furthermore, an acoustic wave element substrate 38 is covered with encapsulation resin 40. When the electronic device 3 to be laminated is an acoustic wave filter element, an encapsulation process is performed while pressure is adjusted such that an acoustic wave excitation space is maintained.

Figure 8:
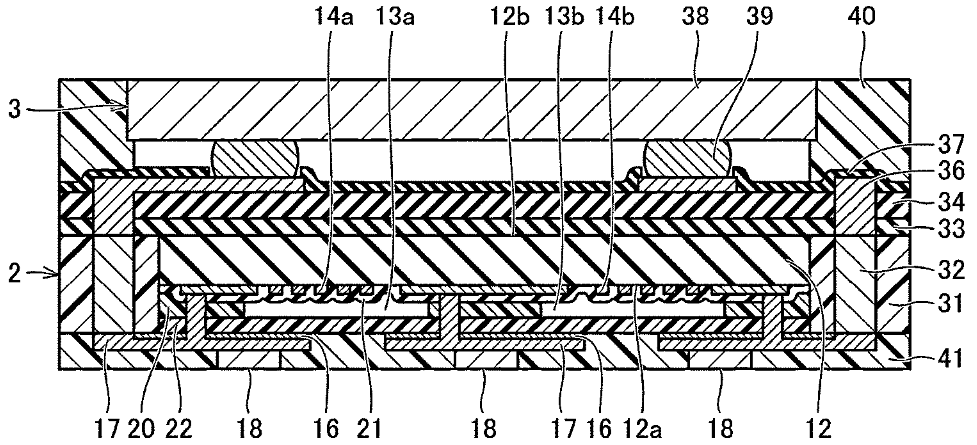
FIG. 8 is a seventh sectional view to explain a method of manufacturing an acoustic wave module according to a preferred embodiment of the present invention.

Next, as illustrated in FIG. 8, the stacked acoustic wave element substrate 38 and the encapsulation resin 40 are polished to reduce a thickness. Although film formation and other processes are performed in subsequent steps in an upside-down state, the following description is continued with the substrates and so on maintained in the orientation illustrated in FIG. 8 for the sake of simplicity. In the following description, therefore, "on (above)" indicates "under (below)" in FIG. 8 in some cases. A metal film 16 is formed on the cover layer 22. More specifically, a resist pattern with an opening in a region where the metal film 16 is to be formed is formed on the cover layer 22, and an Au film is formed in a thickness of, for example, about 0.1 μm by a vapor deposition method. Then, the metal film in an unnecessary region is lifted off and removed together with the resist, such that the metal film 16 in a desired pattern is formed.

Next, a wiring layer 17 and a metal 18 defining and functioning as a pad for soldering are formed on the first surface 12*a* (surface on which a functional portion is disposed) of the acoustic wave device 2 (FIG. 8).

Details of the above-described process are as follows. First, the metal film 16 is formed on the cover layer 22. More specifically, a resist pattern with an opening in a region where the metal film 16 is to be formed is formed on the cover layer 22, and an Au film is formed in a thickness of, for example, about 0.1 μm by a vapor deposition method. Then, the metal film in an unnecessary region is lifted off and removed together with the resist, such that the metal film 16 in a desired pattern is formed.

Then, the wiring layer 17 is disposed on the metal film 16. A pattern of the metal film 16 matches or substantially matches with that of the wiring layer 17. At this time, the pattern of the metal film 16 is intentionally formed to be present in a larger thickness above the encapsulation spaces 13*a* and 13*b*. This is effective in reinforcing the encapsulation spaces 13*a* and 13*b*. As a result, the strength of the cover layer 22 above the encapsulation spaces 13*a* and 13*b* is increased.

In particular, for example, a Ni film with a thickness of about 20 μm is formed on the metal film 16, which is positioned on the cover layer 22, by electrolytic or electroless plating, for example. That Ni film becomes the wiring layer 17. With the formation of the wiring layer 17, the via hole is filled, and wiring to connect the through-electrode 32 and the pad is formed.

Next, an outer shell resin 41 is formed. For example, epoxy resin in the form of a film or epoxy resin obtained by applying liquid resin with a printing technique can be used as the outer shell resin 41. Instead of the epoxy resin, an insulating material, such as, for example, benzocyclobutene resin, silicone resin, or spin-on-glass (SOG), may also be used. The outer shell resin 41 is then solidified. At that time, the outer shell resin 41 is solidified at, for example, about 240° C. by using an oven.

Next, a through-hole (via hole) is formed in the outer shell resin 41 with a laser, for example, and the metal 18 is filled into the via hole by, for example, electrolytic plating. At that time, the via formation may be performed with the photolithography technique by using a photosensitive insulating material as the outer shell resin 41. Alternatively, the via formation may be performed by, for example, dry etching.

Next, as illustrated in FIG. 1, an under-bump metal layer 19*a* is formed on the metal 18. Furthermore, an external terminal 19 for a solder bump is formed on the under-bump metal layer 19*a* by applying a solder paste with, for example, metal mask printing and by heating the solder paste.

Next, the encapsulation resin 40 and the outer shell resin 41 are cut with a dicing machine for separation into individual chips. The acoustic wave module 1 of the stack structure, illustrated in FIG. 1, is thus completed.

In the acoustic wave device 2 and the acoustic wave module 1 manufactured as described above according to the present preferred embodiment, the characteristic deterioration (ripple and spurious response) attributable to the reflection of the unwanted wave (bulk wave) from the second surface 12*b* (rear surface) of the acoustic wave element substrate 12 can be reduced or prevented even when the thickness of the acoustic wave element substrate 12 is reduced. Accordingly, a stack structure body of the acoustic wave filter with good characteristics and a reduced height can be achieved.

First Modification

Figure 9:
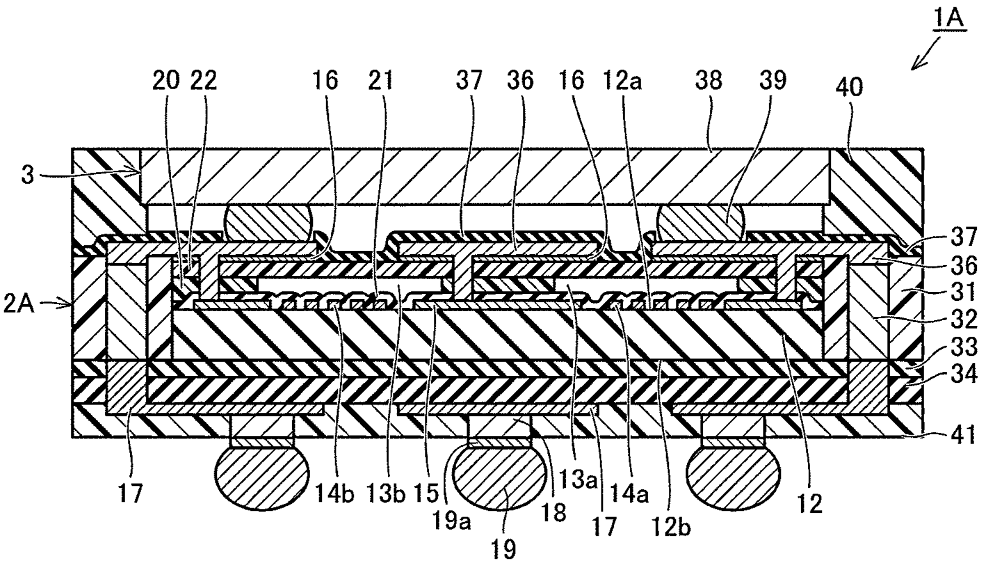
FIG. 9 is a sectional view illustrating a structure of an acoustic wave module 1A according to a first modification of a preferred embodiment of the present invention.

FIG. 9 is a sectional view illustrating a structure of an acoustic wave module 1A according to a first modification of a preferred embodiment of the present invention. While, in FIGS. 1 to 8, the different electronic device 3 is formed on the second surface 12*b* (rear surface) of the acoustic wave element substrate 12, it may be stacked on the first surface 12*a* (surface on which the functional portion is disposed) of the acoustic wave element substrate 12 as illustrated in FIG. 9.

More specifically, as illustrated in FIG. 9, the acoustic wave module 1A further includes a wiring layer 17 provided on the second surface 12*b* side of the acoustic wave element substrate 12 with the first insulator layer 33 and the second insulator layer 34 interposed therebetween.

On that occasion, at least a portion or the entirety of the wiring layer 17 is preferably arranged to overlap the acoustic wave element substrate 12 when looking from a side including the second surface 12*b* (rear surface) of the acoustic wave element substrate 12 in a vertical direction. With that arrangement, the unwanted wave having propagated into the first insulator layer 33 and the second insulator layer 34 is further scattered and attenuated.

Second Modification

Figure 10:
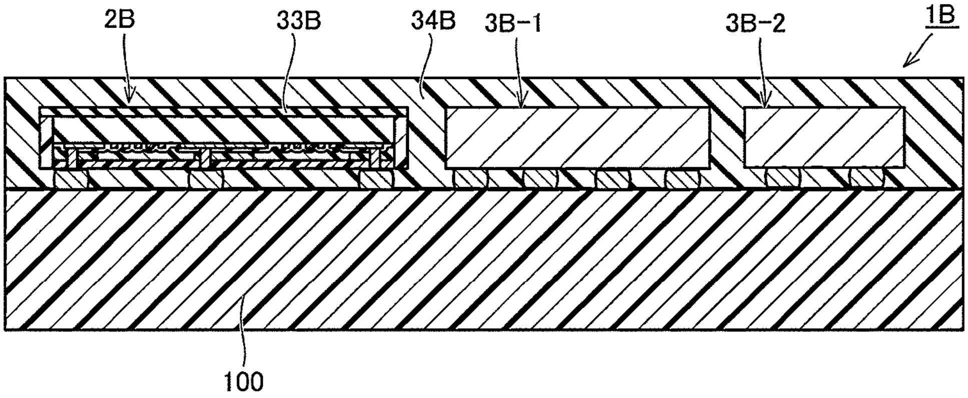
FIG. 10 is a sectional view illustrating a structure of an acoustic wave module 1B according to a second modification of a preferred embodiment of the present invention.

FIG. 10 is a sectional view illustrating a structure of an acoustic wave module 1B according to a second modification of a preferred embodiment of the present invention. The acoustic wave module 1B illustrated in FIG. 10 includes a module substrate 100, an acoustic wave device 2B, an electronic device 3B-1, and an electronic device 3B-2, the three devices being disposed on the module substrate 100. A first insulator layer 33B is provided on a rear surface of the acoustic wave device 2B. After mounting the acoustic wave device 2B, the electronic device 3B-1, and the electronic device 3B-2 onto the module substrate 100, the acoustic wave module 1B is completed by encapsulating the mounted devices with encapsulation resin 34B.

Propagation speeds of a bulk wave in a pass band in an element substrate of the acoustic wave device 2B, the first insulator layer 33B, and the encapsulation resin 34B are denoted by V0, V1, and V2, respectively, and densities of the element substrate of the acoustic wave device 2B, the first insulator layer 33B, and the encapsulation resin 34B are denoted by ρ0, ρ1, and ρ2, respectively. In the second modification, material properties of the first insulator layer 33B and encapsulation resin 34B are selected to satisfy $V0\times\rho0>V1\times\rho1>V2\times\rho2$.

More specifically, as illustrated in FIG. 10, the acoustic wave device 2B in a stage in which the first insulator layer 33B satisfying $V0\times\rho0>V1\times\rho1$ is provided on a rear surface of the substrate of the acoustic wave device 2B is prepared. Then, the acoustic wave device 2B is mounted on the module substrate 100 and is sealed by molding with the encapsulation resin 34B that is made of a material satisfying $V0\times\rho0>V1\times\rho1>V2\times\rho2$. Even when the acoustic wave module 1B is assembled as described above, the same or similar advantageous effects can also be obtained.

The above-described acoustic wave devices and acoustic wave modules according to preferred embodiments of the present preferred embodiment describe below.

Preferred embodiments of the present invention describe the acoustic wave device 2 having the predetermined pass band BW. The acoustic wave device 2 illustrated in FIG. 1 includes the acoustic wave element substrate 12, the comb-shaped filter electrodes 14*a* and 14*b* on the first surface 12*a* of the acoustic wave element substrate 12 and allows the acoustic wave in the pass band BW to pass therethrough, the first insulator layer 33 covering the second surface 12*b* of the acoustic wave element substrate, and the second insulator layer 34 laminated on the first insulator layer 33 and sandwiching the first insulator layer 33 between the second insulator layer 34 and the acoustic wave element substrate 12. Assuming that the propagation speeds of the acoustic wave in the pass band in the acoustic wave element substrate 12, the first insulator layer 33, and the second insulator layer 34 are denoted by V0, V1, and V2, respectively, and that the densities of the acoustic wave element substrate, the first insulator layer, and the second insulator layer are denoted by ρ0, ρ1, and ρ2, respectively, $V0\times\rho0>V1\times\rho1>V2\times\rho2$ is satisfied.

Figure 11:
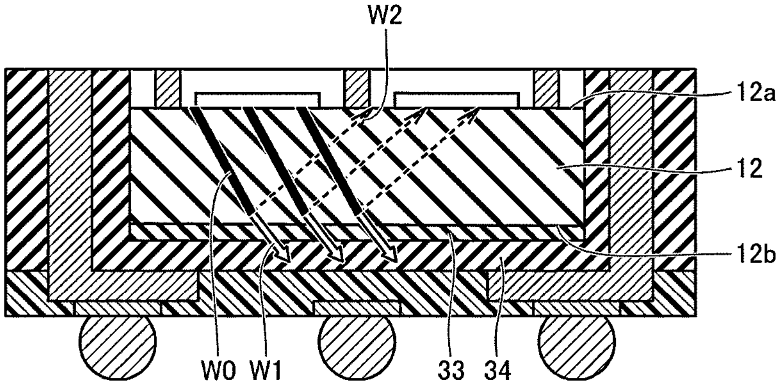
FIG. 11 is a schematic view to explain reflection and attenuation of a bulk wave.
Figure 12:
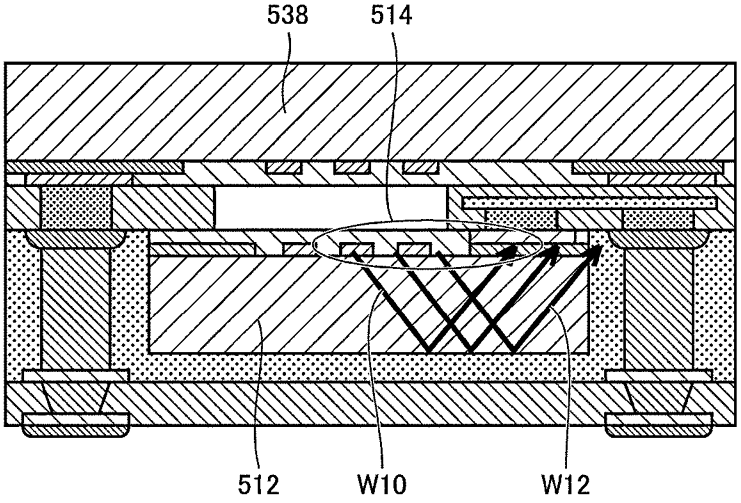
FIG. 12 is an explanatory view to explain a problem with a reduction in thickness of an acoustic wave element substrate.

FIG. 11 is a schematic view to explain reflection and attenuation of the bulk wave.

Since the first insulator layer 33 and the second insulator layer 34 having the above-described material properties are disposed on the second surface 12*b* (rear surface) of the acoustic wave element substrate 12, a bulk wave W0 is less likely to reflect at the interface between the acoustic wave element substrate 12 and the first insulator layer 33. Therefore, a reflected wave W2 is weakened, and the characteristic deterioration of the acoustic wave device is reduced or prevented. Moreover, the adverse influence of a bulk wave W1 propagating into the insulator layers upon the characteristics of the acoustic wave device is also reduced because the bulk wave W1 is attenuated in the insulator layers.

Preferably, the elastic modulus of the first insulator layer 33 and the elastic modulus of the second insulator layer 34 are each smaller than the elastic modulus of the acoustic wave element substrate 12. With this feature, the bulk wave component returning to the acoustic wave element substrate 12 again is more highly attenuated than the bulk wave component immediately before reflecting at the interface, and this is advantageous in reducing or preventing the characteristic deterioration of the acoustic wave device.

Preferably, the surface roughness RSm of the second surface 12*b* of the acoustic wave element substrate 12 is smaller than the wavelength of the acoustic wave in the pass band BW. By setting the surface roughness RSm of the second surface 12*b* of the acoustic wave element substrate 12 to be smaller (shorter) than the wavelength of the acoustic wave in the pass band, the bulk wave can be scattered in the boundary portion between the acoustic wave element substrate 12 and the first insulator layer 33.

Preferably, as illustrated in FIG. 9, the acoustic wave device further includes the wiring layer 17 provided on the second surface 12*b* side of the acoustic wave element substrate 12 with the first insulator layer 33 or the second insulator layer 34 interposed between the wiring layer and the acoustic wave element substrate. With this feature, the unwanted wave propagating into the first insulator layer 33 and the second insulator layer 34 are further scattered and attenuated.

The following examples of combinations of material properties are preferably used for the first insulator layer 33 and the second insulator layer 34.

Preferably, the first insulator layer 33 and the second insulator layer 34 are epoxy resin layers including the same filler, and the content of the filler in the first insulator layer 33 is higher than the content of the filler in the second insulator layer 34. In this case, more preferably, the filler is alumina or silica.

Preferably, the first insulator layer 33 is an epoxy resin layer including alumina as the filler, and the second insulator layer 34 is an epoxy resin layer including silica as the filler.

Preferably, the first insulator layer 33 includes glass as a main component, and the second insulator layer 34 includes epoxy resin as a main component. Here, the "main component" indicates a component with the content of 50% or more. For example, a SOG (Spin-coating On Glass) film can be used as the first insulator layer 33.

Preferably, the first insulator layer 33 includes epoxy resin, and the second insulator layer 34 includes polyimide resin.

Preferred embodiments of the present invention further relate to the acoustic wave module 1 or 1A including the above-described acoustic wave device 2 or 2A.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave module comprising:

an acoustic wave device with a predetermined pass band, the acoustic wave device including:

an acoustic wave element substrate;

a comb-shaped filter electrode provided on a first surface of the acoustic wave element substrate to allow an acoustic wave in the predetermined pass band to pass therethrough;

a first insulator layer covering a second surface of the acoustic wave element substrate; and a second insulator layer laminated on the first insulator layer and sandwiching the first insulator layer between the second insulator layer and the acoustic wave element substrate;

an electronic device stacked on the acoustic wave device; and a wiring layer on a second surface side of the acoustic wave element substrate with the first insulator layer or the second insulator layer interposed between the wiring layer and the acoustic wave element substrate; wherein assuming that propagation speeds of the acoustic wave in the predetermined pass band in the acoustic wave element substrate, the first insulator layer, and the second insulator layer are denoted by V0, V1, and V2, respectively, and densities of the acoustic wave element substrate, the first insulator layer, and the second insulator layer are denoted by ρ0, ρ1, and ρ2, respectively, V0×ρ0>V1×ρ1 >V2×ρ2 is satisfied;

a thickness of each of the first insulator layer and the second insulator layer is about 1 μm to about 20 μm; and the wiring layer is electrically connected to the electronic device.

2. The acoustic wave module according to claim 1, wherein an elastic modulus of the first insulator layer and an elastic modulus of the second insulator layer are each smaller than an elastic modulus of the acoustic wave element substrate.

3. The acoustic wave module according to claim 1, wherein a surface roughness of the second surface of the acoustic wave element substrate is smaller than a wavelength of the acoustic wave in the predetermined pass band.

4. The acoustic wave module according to claim 1, wherein the first insulator layer and the second insulator layer are each an epoxy resin layer including a filler; and a content of the filler in the first insulator layer is higher than a content of the filler in the second insulator layer.

5. The acoustic wave module according to claim 4, wherein the filler is alumina or silica.

6. The acoustic wave module according to claim 1, wherein the first insulator layer is an epoxy resin layer including alumina as a filler; and the second insulator layer is an epoxy resin layer including silica as a filler.

7. The acoustic wave module according to claim 1, wherein the first insulator layer includes glass as a main component; and the second insulator layer includes epoxy resin as a main component.

8. The acoustic wave module according to claim 1, wherein the first insulator layer includes epoxy resin; and the second insulator layer includes polyimide resin.

9. The acoustic wave module according to claim 1, wherein the acoustic wave element includes $LiTaO_3$ or $LiNbO_3$.

10. An acoustic wave module comprising:

an acoustic wave device with a predetermined pass band, the acoustic wave device including:

an acoustic wave element substrate;

a comb-shaped filter electrode provided on a first surface of the acoustic wave element substrate to allow an acoustic wave in the predetermined pass band to pass therethrough;

a first insulator layer covering a second surface of the acoustic wave element substrate; and a second insulator layer laminated on the first insulator layer and sandwiching the first insulator layer between the second insulator layer and the acoustic wave element substrate;

an electronic device stacked on the acoustic wave device; and a wiring layer on a first surface side of the acoustic wave element substrate; wherein assuming that propagation speeds of the acoustic wave in the predetermined pass band in the acoustic wave element substrate, the first insulator layer, and the second insulator layer are denoted by V0, V1, and V2, respectively, and densities of the acoustic wave element substrate, the first insulator layer, and the second insulator layer are denoted by ρ0, ρ1, and ρ2, respectively, V0×ρ0>V1×ρ1>V2×ρ2 is satisfied;

a thickness of each of the first insulator layer and the second insulator layer is about 1 μm to about 20 μm; and the wiring layer is electrically connected to the electronic device.

11. The acoustic wave module according to claim 10, wherein an elastic modulus of the first insulator layer and an elastic modulus of the second insulator layer are each smaller than an elastic modulus of the acoustic wave element substrate.

12. The acoustic wave module according to claim 10, wherein a surface roughness of the second surface of the acoustic wave element substrate is smaller than a wavelength of the acoustic wave in the predetermined pass band.

13. The acoustic wave module according to claim 10, wherein the first insulator layer and the second insulator layer are each an epoxy resin layer including a filler; and a content of the filler in the first insulator layer is higher than a content of the filler in the second insulator layer.

14. The acoustic wave module according to claim 13, wherein the filler is alumina or silica.

15. The acoustic wave module according to claim 10, wherein the first insulator layer is an epoxy resin layer including alumina as a filler; and the second insulator layer is an epoxy resin layer including silica as a filler.

16. The acoustic wave module according to claim 10, wherein the first insulator layer includes glass as a main component; and the second insulator layer includes epoxy resin as a main component.

17. The acoustic wave module according to claim 10, wherein the first insulator layer includes epoxy resin; and the second insulator layer includes polyimide resin.

18. The acoustic wave module according to claim 10, wherein the acoustic wave element includes $LiTaO_3$ or $LiNbO_3$.

* * * * *